(12) United States Patent (10) Patent No.: US 7,871,888 B2
Nishimura (45) Date of Patent: Jan. 18, 2011

(54) METHOD OF MANUFACTURING SEMICONDUCTOR DEVICE

(75) Inventor: Takeyoshi Nishimura, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 261 days.

(21) Appl. No.: 12/257,175

(22) Filed: Oct. 23, 2008

(65) Prior Publication Data

US 2009/0111230 A1 Apr. 30, 2009

(30) Foreign Application Priority Data

Oct. 24, 2007 (JP) .............................. 2007-276456

(51) Int. Cl.
*H01L 29/78* (2006.01)
(52) U.S. Cl. ...................... 438/286; 438/138; 438/285; 257/335; 257/E21.417
(58) Field of Classification Search ................ 438/138, 438/139, 285, 286; 257/335, E21.417, E29.261
See application file for complete search history.

(56) References Cited

U.S. PATENT DOCUMENTS 6,118,150 A 9/2000 Takahashi

2010/0123195 A1* 5/2010 Lee ........................... 257/335

FOREIGN PATENT DOCUMENTS

| JP | 8-78668 A | 3/1996 |
|---|---|---|
| JP | 10-56174 A | 2/1998 |
| JP | 3410286 B2 | 3/2003 |
| JP | 2006-80177 A | 3/2006 |

* cited by examiner

*Primary Examiner*—Fernando L Toledo
(74) *Attorney, Agent, or Firm*—Rossi, Kimms & McDowell LLP

(57) ABSTRACT

A p⁻ RESURF region is formed as a surface layer in an n⁻ semiconductor layer. Then, trenches, gate insulating films, and a thick insulating film, gate electrodes, and a gate polysilicon interconnection are formed in this order. Subsequently, a p-well region is formed using the gate polysilicon interconnection as a mask. Then n⁺ source regions are formed. Since the p⁻ RESURF region is formed and the p-well region is formed after forming the gate electrodes and the gate polysilicon interconnection, the severeness of a high-temperature heat history is lowered and the diffusion depth of the p-well region is decreased. The formation of the p⁻ RESURF region and the shallow p-well region makes it possible to reduce the on-resistance while increasing the breakdown voltage, as well as reducing the gate capacitance.

6 Claims, 20 Drawing Sheets

METHOD OF MANUFACTURING SEMICONDUCTOR DEVICE

BACKGROUND

FIGS. 10 and 11A-11C schematically illustrate the configuration of a conventional MOSFET metal-oxide semiconductor field-effect transistor (MOSFET) having trench gate electrodes. FIG. 10 is a plan view of the MOSFET. FIGS. 11A-11C are sectional views taken along lines 11A-1A, 11B-11B, and 11C-11C of FIG. 10. FIGS. 11A-11C, omit the back-side $n^+$ semiconductor substrate on which an $n^-$ semiconductor layer 1 is formed, and layers, regions, etc., formed above and on/in the $n^-$ semiconductor layer 1. A vertical insulated-gate bipolar transistor (IGBT) can be obtained by replacing the $n^+$ semiconductor substrate with a $p^+$ semiconductor substrate or replacing the $n^-$ semiconductor layer 1 with an $n^-$ semiconductor substrate and forming a p-type collector layer on its back surface.

A p-well region 10 (p-channel region) is formed (as a surface layer) in the $n^-$ semiconductor layer 1. Striped trenches 4 penetrate through the p-well region 10 and reach the $n^-$ semiconductor layer 1. Gate insulating films 5 are formed on the surfaces of the trenches 4, and polysilicon gate electrodes 7 are formed in the trenches 4, with the gate insulating films 5 interposed in between. $N^+$ source regions 11 are formed adjacent to the trenches 4 (as surface layers) in the p-well region 10. The $n^+$ source regions 11 are connected to a source electrode 14 through contact holes 13 formed through an interlayer insulating film 12. A terminal portion, which extend along the longitudinal direction of the trench 4, of each gate electrode 7 is connected to a gate polysilicon interconnection 8, which is connected to a gate metal interconnection 15. The gate polysilicon interconnection 8 functions as a field plate. A p-type end region 3 is formed along the chip outer periphery, e.g., circumference. The p-type end region 3 and an end polysilicon film 9 are connected to metal films 16 through contact holes 13 formed through the interlayer insulating film 12.

FIGS. 12A-12B to FIGS. 16A-16C schematically illustrate the method steps, executed in order, of a manufacturing method of the conventional MOSFET having trench gate electrodes of FIGS. 10 and 11A-11C. FIGS. 12A-16A are plan views of the MOSFET. FIGS. 12B-16B are sectional views of the MOSFET taken along lines 12B-12B, 13B-13B, 14B-14B, 15B-15B, and 16B-16B of FIGS. 12A-16A. FIGS. 13C-16C are sectional views of the MOSFET taken along lines 13C-13C, 14C-14C, 15C-15C, 16-C-16C of FIGS. 13A-16A.

Referring to FIGS. 12A and 12B, the p-well region 10 and the p-type end region 3 are formed simultaneously in the $n^-$ semiconductor layer 1. Reference symbol a denotes an edge of the p-well region 10. Referring to FIGS. 13A-13C, the striped trenches 4 penetrate through the p-well region 10 and reach the $n^-$ semiconductor layer 1. Then, as shown in FIGS. 14A-14C, the surfaces of the trenches 4 are covered with the gate insulating films 5 and filled with a polysilicon material (e.g., film) to form the polysilicon gate electrodes 7. At this time, the polysilicon film is also applied to a thick insulating film 6, which is formed on an end portion of the p-well region 10, an inside end portion of the p-type end region 3, and an exposed portion of the $n^-$ semiconductor layer 1 (i.e., an edge breakdown-resistant structure) and patterned into the gate polysilicon interconnection 8 and the end polysilicon film 9.

Subsequently, as shown in FIGS. 15A-15C, $n^+$ source regions 11 are formed adjacent to the trenches 4 (as surface layers) in the p-well region 10. Finally, as shown in FIGS. 16A-16C, an interlayer insulating film 12 and contact holes 13 are formed. A source electrode 14 is formed connected to the $n^+$ source regions 11, a gate metal interconnection 15 is formed connecting to the gate polysilicon interconnection 8, and metal films 16 are formed connecting to the p-type end region 3 and the end polysilicon film 9.

In the vertical MOSFET having trench gate electrodes manufactured in the above-described manner, the channel resistance component is reduced because of the increased channel density due to miniaturization. On the other hand, to reduce the on-resistance, it is also necessary to reduce the resistance component of the drift layer ($n^-$ semiconductor layer 1). To this end, the resistivity and the thickness of the drift layer need to be reduced, which deteriorates the breakdown voltage characteristic as long as the conventional edge breakdown-resistant structure is employed.

As mentioned above, the channel resistance component is reduced because of the increased channel density due to miniaturization. But since the p-well region 10 is formed before the gate electrodes 7, the diffusion depth of the p-well region 10 is increased as shown in FIG. 17 due to a heat history (heat treatment) occurring in later steps, such as the step of forming the gate insulating films 5 (gate oxide films). As a result, the channel length increases and the channel resistance component increases accordingly. This partially cancels out the beneficial effect of the miniaturization.

Where the gate insulating films 5 are oxide films, the gate oxide films absorb the impurity from the p-well region 10 and the impurity concentration of the p-well region 10 is lowered in portions close to the side surfaces of the trenches 4, so that the bottom surface of the p-well region 10 becomes curved as shown in FIG. 17. As a result, a J-FET effect (i.e., a phenomenon that junction MOSFETs is formed to increase the on-resistance) occurs near the bottoms of the trenches 4, thereby increasing the on-resistance.

When the diffusion depth of the p-well region 10 is increased, the gate capacitance (gate-drain capacitance) is increased, and the switching speed is thereby lowered, increasing the switching loss. Furthermore, the increase in the diffusion depth of the p-well region 10 makes it necessary to increase the depth of the trenches 4 as shown in FIG. 18, which reduces the breakdown voltage. To prevent this problem, it is necessary to make the $n^-$ semiconductor layer 1 thicker. Where the $n^-$ semiconductor layer 1 is formed by epitaxial growth, this means cost increase.

U.S. Pat. No. 6,118,150 (Japanese Patent No. 3,410,286), JP-A-8-78668, and JP-A-10-56174 disclose a technique for forming a deep p-type region (corresponds to a RESURF region (described later)) adjacent to the end of an active region (corresponds to the above-described p-well region 10) in a vertical MOS trench gate device. USPGP 2006-54970 (JP-A-2006-80177) discloses a technique for forming a channel layer (corresponds to the above-described p-well region 10) after forming gate oxide films and gate electrodes, to prevent thickening of the p-well region 10 due to the heat history (in forming the gate insulating films 5, the thick insulating film 6, etc.) by forming the trenches 4, the gate insulating films 5, the thick insulating film 6, the gate electrodes 7, and the gate polysilicon interconnection 8 in this order before forming the p-well region 10.

In the above technique, however, as shown in FIGS. 19-21, the gate polysilicon interconnection 8 formed at the same time as the gate electrodes 7 covers the surface portion that extends outward from tip portions of the striped trenches 4. Therefore, the p-well region 10, which is formed at a later step, is not formed around the tip portions of the trenches 4. This means that the end of the p-well region 10 retreats from position a to position b. See FIG. 19, which schematically illustrates a plan view of the MOSFET. FIGS. 20A-20C are sectional views of MOSFET taken along lines 20A-20A, 20B-20B, and 20C-20C of FIG. 19. FIG. 21 is an enlarged view of part E21 of FIG. 19.

As a result, as shown in FIGS. 20B and 21, the side surfaces of the tip portions of the trenches 4 are not surrounded by the p-well region 10 and come into contact with the n⁻ semiconductor layer 1. The degree of electric field concentration is increased there, hence lowering the breakdown voltage. For this reason, it is undesirable to form the gate electrodes 7 and the gate polysilicon interconnection 8 simultaneously before forming the p-well region 10. Moreover, if the diffusion depth of the p-well region 10 is small, the electric field intensity is increased along the edge a, which makes it difficult to attain a high breakdown voltage. The above-described problems will be described below in more detail.

In the method in which the gate electrodes 7 and the gate polysilicon interconnection 8 are formed after forming the p-well region 10 (channel region), the impurity (channel impurity) of the p-well region 10 is absorbed in the later oxidizing step (forming the gate oxide films and the thick oxide film), where the p-well region 10 (channel region) becomes shallow near the side surfaces of the trenches 4 and deep in central portions of the cells that are distant from the trench gate electrodes 7. The on-resistance is increased due to the J-FET effect. In this case, to suppress the J-FET effect, which is caused by the increased diffusion depth of the p-well region 10 (i.e., the depth of the channel diffusion) in the cell central portions, it is necessary to deepen the trench gates (i.e., the gate electrodes 7 in the trenches 4). As a result, the surface areas of the p-well region 10 (channel region) and those portions of the gate electrodes 7 that project from the p-well region 10 are increased, which increases the gate capacitance of the trench 4 part to deteriorate the switching characteristic.

Accordingly, there remains a need for manufacturing a semiconductor device that can reduce the on-resistance while increasing the breakdown voltage, and that can improve the switching characteristic by reducing the gate capacitance. The present invention addresses this need.

SUMMARY OF THE INVENTION

The present invention relates to a manufacturing method of a semiconductor device, such as a MOSFET having trench gate electrodes or an IGBT. More specifically, the present invention relates to the method where a RESURF region is formed first and then trenches are formed, followed by the trench gate electrodes, and thereafter a well region, as a channel region, in contact with the RESURF region is formed intersecting the RESURF region.

According to one aspect of the present invention, a method of forming a semiconductor, which can be a MOSFET or IGBT includes the steps of, forming a RESURF region of a second-conductivity type in one surface of a semiconductor layer of a first-conductivity type, wherein the RESURF region has an annular configuration, forming a plurality of trenches from the one surface of the semiconductor layer after forming the RESURF region, wherein each of the trenches has a striped configuration and a depth smaller than a diffusion depth of the RESURF region, and wherein the RESURF region surrounds the trenches with opposite longitudinal ends of each of the trenches overlapping portions of the RESURF region, forming trench gate electrodes in the trenches with a first insulating film interposed between each of the trench gate electrodes and the trenches after forming the trenches, and forming a well region of the second-conductivity type in the one surface of the semiconductor layer, wherein the well region intersects the RESURF region.

According to another aspect of the present invention, the method comprises the steps of, providing a semiconductor layer of a first-conductivity type, forming a first semiconductor region of a second-conductivity type in one surface of the semiconductor layer, wherein the first semiconductor region has an annular configuration, forming a plurality of trenches from the one surface of the semiconductor layer, wherein each of the trenches having a striped configuration and a depth smaller than a diffusion depth of the first semiconductor region, and wherein the first semiconductor region surrounds the trenches with opposite longitudinal ends of each of the trenches overlapping portions of the first semiconductor region, covering the trenches and portions of the first semiconductor region adjacent to the opposite longitudinal ends of the trenches with a first insulating film, covering an outer portion of the first semiconductor region and a portion of the semiconductor layer surrounding the first semiconductor region with a second insulating film that is thicker than the first insulating film, wherein the second insulating film is connected to the first insulating film, filling each of the trenches with a conductive material, with the first insulating film interposed in between, and covering part of the second insulating film with the conductive material.

The method further includes the steps of forming a second semiconductor region of the second-conductivity type in the one surface of the semiconductor layer using the conductive material as a mask, wherein an impurity concentration of the second semiconductor region is higher than that of the first semiconductor region, a diffusion depth of the second semiconductor region is smaller than the depth of the trenches, and an outer portion of the second semiconductor region coextends with an inner portion of the first semiconductor region.

The method further includes forming third semiconductor regions of the first-conductivity type in the one surface of the semiconductor layer, wherein the third semiconductor regions are formed adjacent to side surfaces of the trenches and extend along a longitudinal direction of the trenches, and wherein an impurity concentration of the third semiconductor regions is higher than the impurity concentration of the second semiconductor region.

The first semiconductor region can be a RESURF region, the second semiconductor region can be a well region, the first insulating film can include gate insulating films, and the second insulating film can be a thick insulating film.

The annular shape of the first semiconductor region can be substantially rectangular, with rounded corners, and the longitudinal direction of the trenches can be parallel to at least one straight portion of the annular first semiconductor region. The conductive film can have an opening that is larger than and similar to an opening in the annular first semiconductor region.

DETAILED DESCRIPTION

Figure 1:
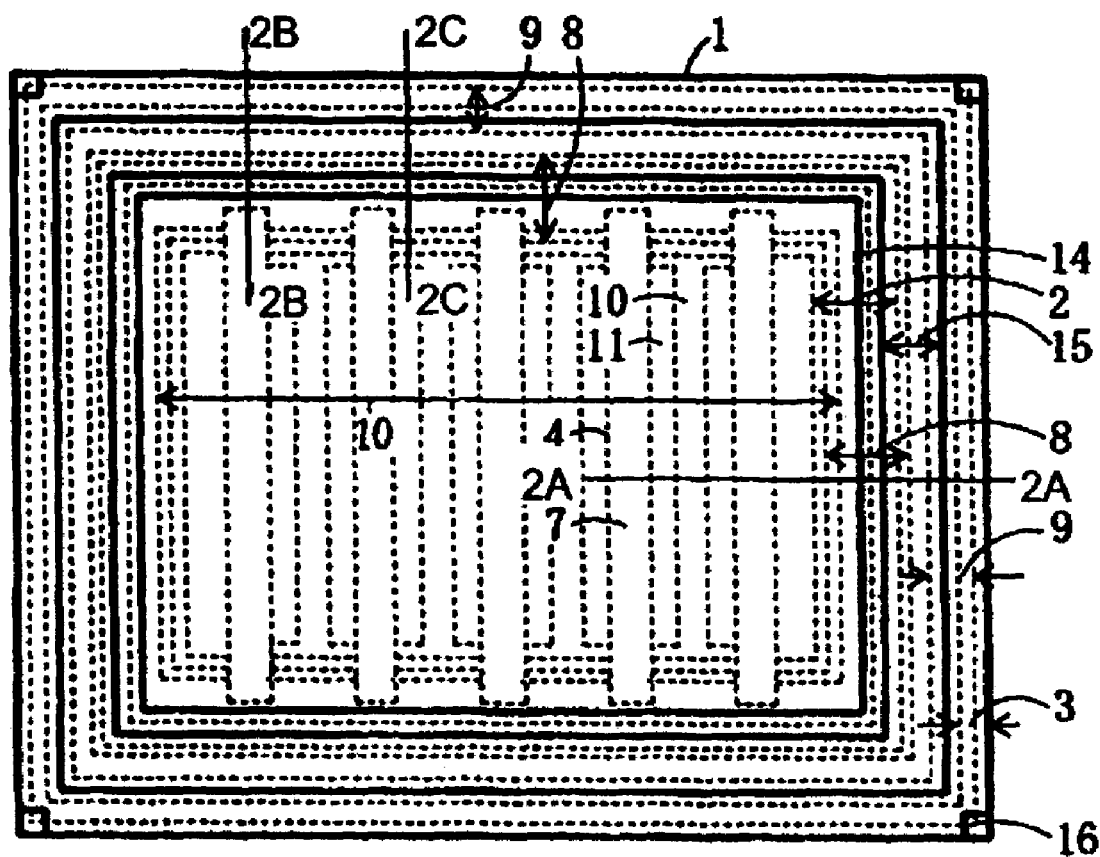
FIG. 1 schematically illustrates a plan view of a semiconductor device manufactured by a manufacturing method according to the present invention.
Figure 2A:
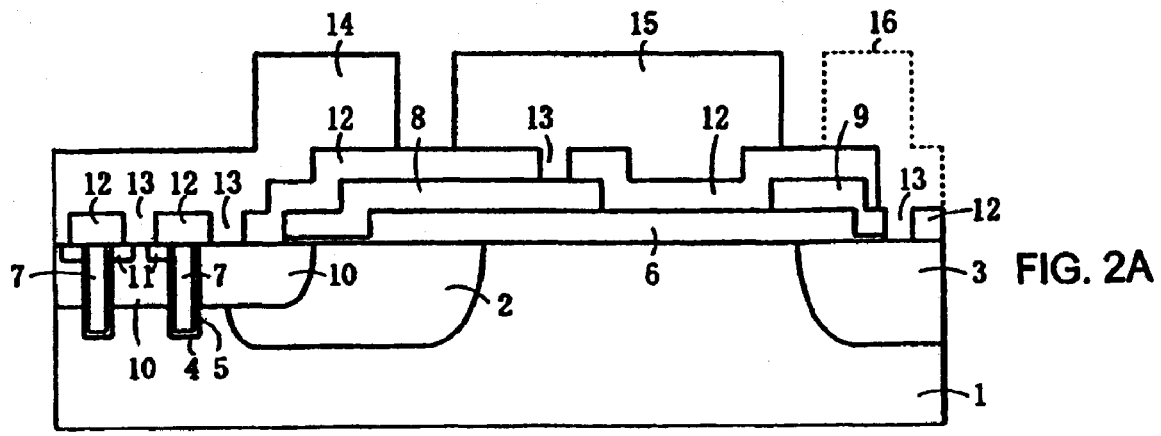
FIGS. 2A-2C schematically illustrate sectional views taken along lines 2A-2A, 2B-2B, and 2C-2C of FIG. 1.
Figure 2B:
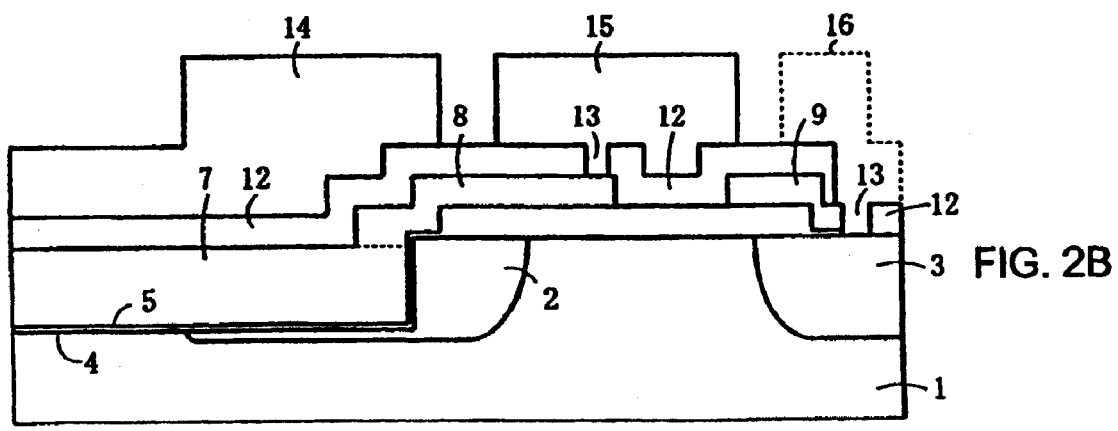
Figure 2C:
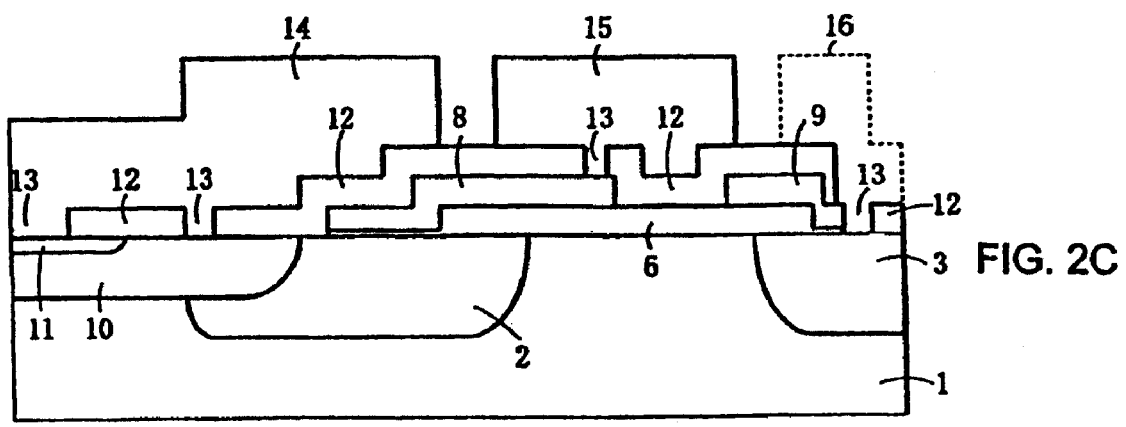

An embodiment of a semiconductor device, namely a vertical n-channel MOSFET having a trench gate structure, is described. Layers, regions, etc., corresponding to elements of the above-described conventional MOSFET are given the same reference symbols. Although in the embodiment described here refers the first conductivity type as the n type and the second conductivity type as the p-type, the conductivity types can be reversed. Superscripts "+" and "−" following "p" and "n" mean that the impurity concentration is high and low, respectively.

Referring to FIGS. 1 and 2A-2C, the vertical n-channel MOSFET having a trench gate structure includes an n⁻ semiconductor layer 1 (n⁻ drift layer) formed on an n⁺ semiconductor substrate (not shown), and layers, regions, etc. formed over or in the surface of the n⁻ semiconductor layer 1. A vertical IGBT can be obtained by replacing the n⁺ semiconductor substrate (not shown) with a p⁺ semiconductor substrate or replacing the n⁻ semiconductor layer 1 with an n⁻ semiconductor substrate and forming a p⁺ collector layer on its back surface.

A p-well region 10, a p⁻ RESURF region 2, and a p-type end region 3 are formed (as surface layers) in the surface of the n⁻ semiconductor layer 1. The p⁻ RESURF region 2 is in contact with the p-well region 10 and the p-type end region 3 extends along the chip outer periphery. Striped trenches 4 penetrate through the p-well region 10 and reach the n⁻ semiconductor layer 1. Gate insulating films 5 are formed on the surfaces of the trenches 4, and polysilicon gate electrodes 7 are formed in the trenches 4 with the gate insulating films 5 interposed in between. N⁺ source regions 11 are formed adjacent to the trenches 4 (as surface layers) in the surface of the p-well region 10. The n⁺ source regions 11 are connected to a source electrode 14 through contact holes 13, which are formed through an interlayer insulating film 12. A terminal portion, in the longitudinal direction of the trench 4, of each gate electrode 7 is connected to a gate polysilicon interconnection 8, which is connected to a gate metal interconnection 15 through a contact hole 13, which is formed through the interlayer insulating film 12. The gate polysilicon interconnection 8 functions as a field plate.

An end polysilicon film 9 is formed over the p-type end region 3 extending along the chip outer periphery with a thick insulating film 6 interposed in between. Metal films 16 are formed at the chip corners connecting to the p-type end region 3 and the end polysilicon film 9. The thick insulating film 6 is formed below the gate polysilicon interconnection 8 and the end polysilicon film 9.

Figure 3A:
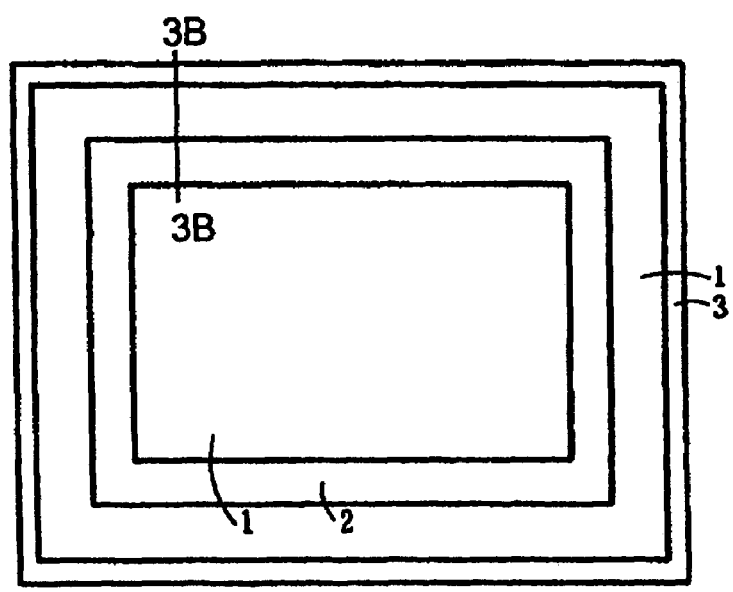
FIGS. 3A-3B to FIGS. 8A-8C schematically illustrate the manufacturing process of the semiconductor device of FIGS. 1 and 2A-2C.
Figure 3B:
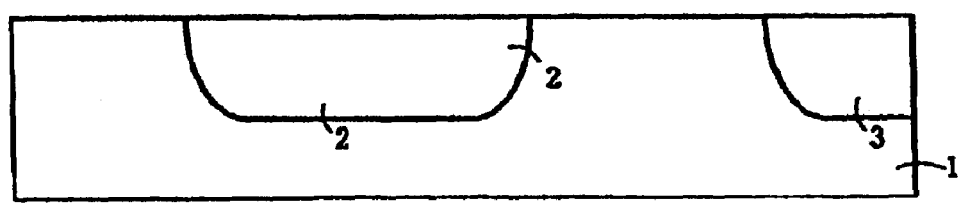
Figure 4A:
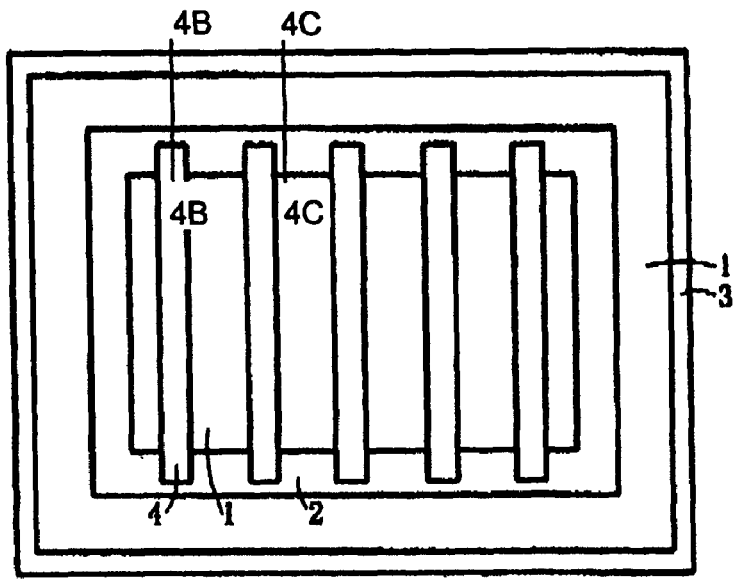
Figure 4B:
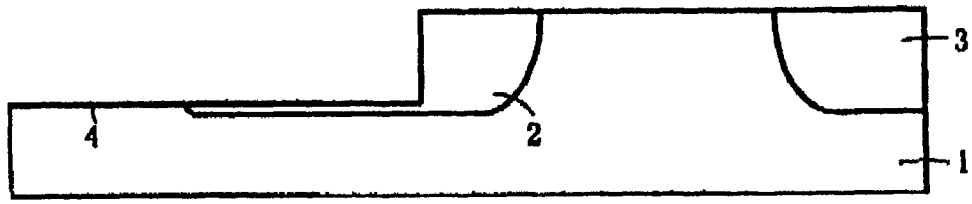
Figure 4C:
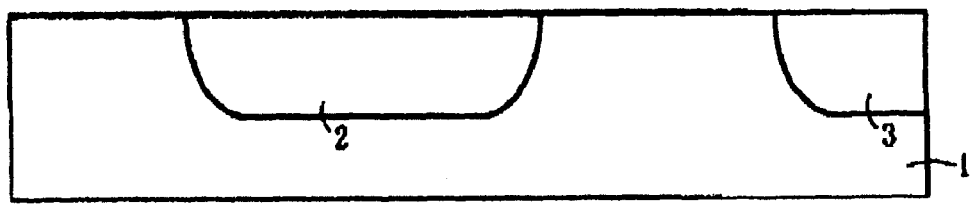

Referring to FIGS. 3A and 3B, the p⁻ RESURF region 2 and the p-type end region 3, each are annular, i.e., ring shaped, with the p-type end region 3 surrounding or enclosing the RESURF region 2, are formed in the surface of the n⁻ semiconductor layer 1. The impurity concentration of the RESURF region 2 is set to not become depleted to the surface (i.e., not depleted completely) when a voltage corresponding to a device breakdown voltage is applied between the source electrode 14 and the drain electrode (back-side electrode; not shown). Thereafter, the trenches 4 are formed in striped configuration from the surface of the n⁻ semiconductor layer 1, with their depth shallower than the RESURF region 2 and overlapping with the RESURF region 2 at both ends of the trenches. The outermost trenches 4 are located inside the two opposite portions extending parallel to the trenches 4, so that only the lateral opposite end portions of the trenches 4 overlap the RESURF region 2 as shown in FIG. 4A.

Figure 5A:
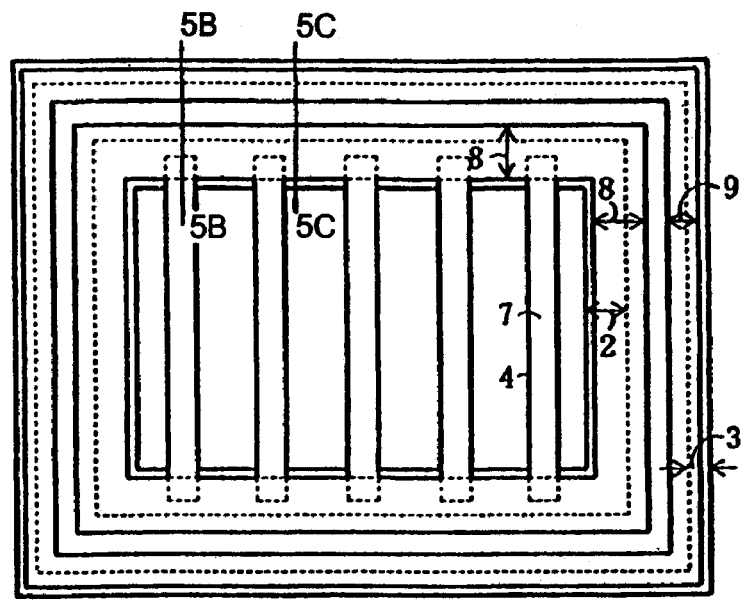
Figure 5B:
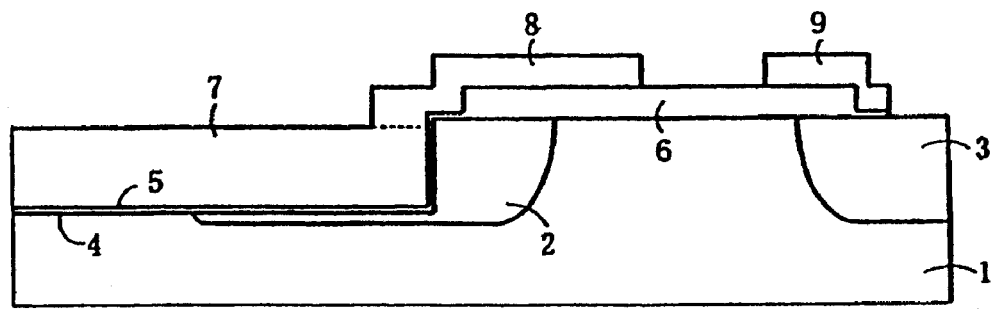
Figure 5C:
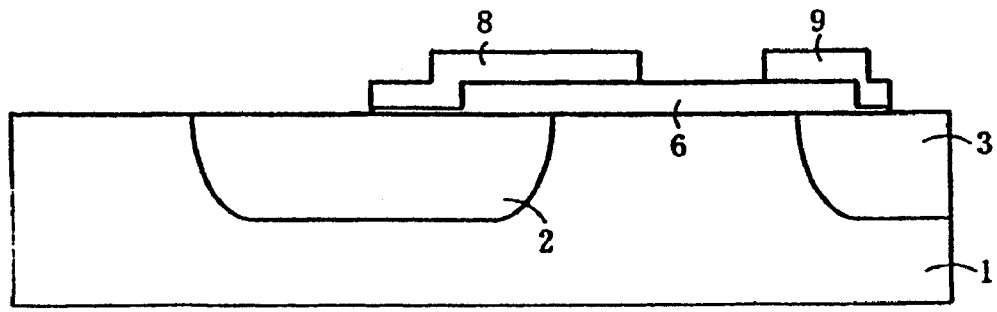

Referring to FIGS. 5A-5C, thereafter the surfaces of the trenches 4 are covered with the gate insulating film 5 (e.g., gate oxide films). The surfaces of the p⁻ RESURF region 2, the n⁻ semiconductor layer 1, and the p-type end region 3 are covered with a thick insulating film 6 (e.g., oxide film), and the trenches 4 are filled with polysilicon to form polysilicon gate electrodes 7. At the same time, the gate polysilicon interconnection 8, which is connected to the gate electrodes 7, and the end polysilicon film 9 are formed. The gate polysilicon interconnection 8 is formed to cover tip portions (lateral opposite end portions) of the trenches 4.

Figure 6A:
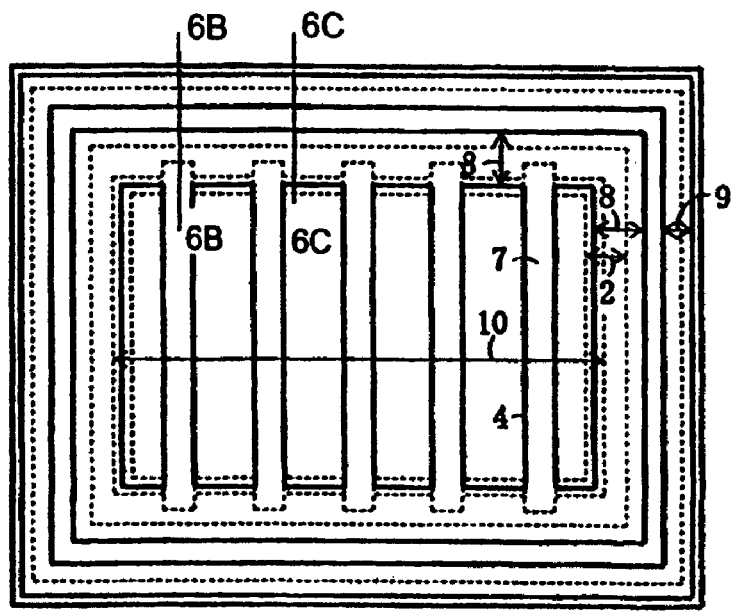
Figure 6B:
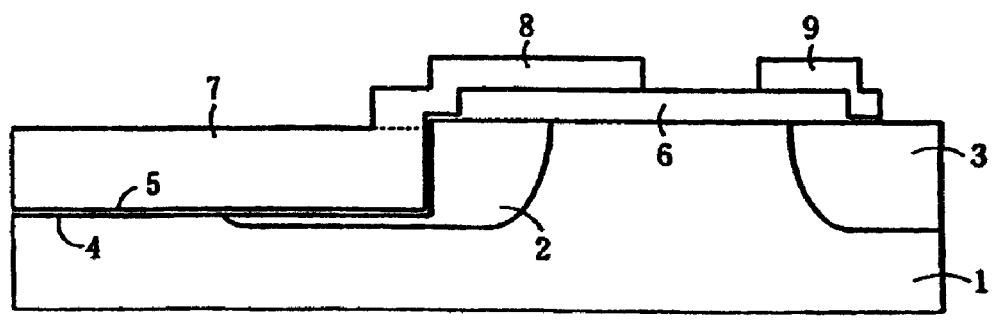
Figure 6C:
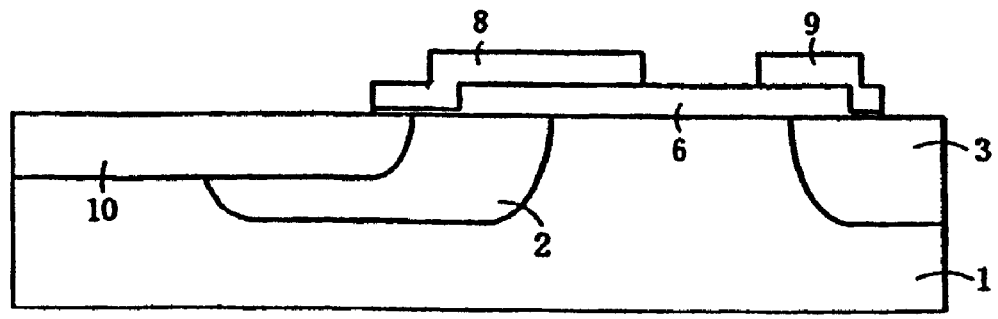

Referring to FIGS. 6A-6C, thereafter the p-well region 10 is formed overlapping with the p⁻ RESURF region 2 using the gate polysilicon interconnection 8 as a mask. Although at this time the p-type region is also formed in the p-type end region 3 with the end polysilicon film 9 serving as a mask, it is omitted in FIGS. 6A-6C. Since the thick insulating film 6 lies on that portion of the n⁻ semiconductor layer 1, which is located between the gate polysilicon interconnection 8 and the end polysilicon film 9, no p-type region is formed there.

Figure 7A:
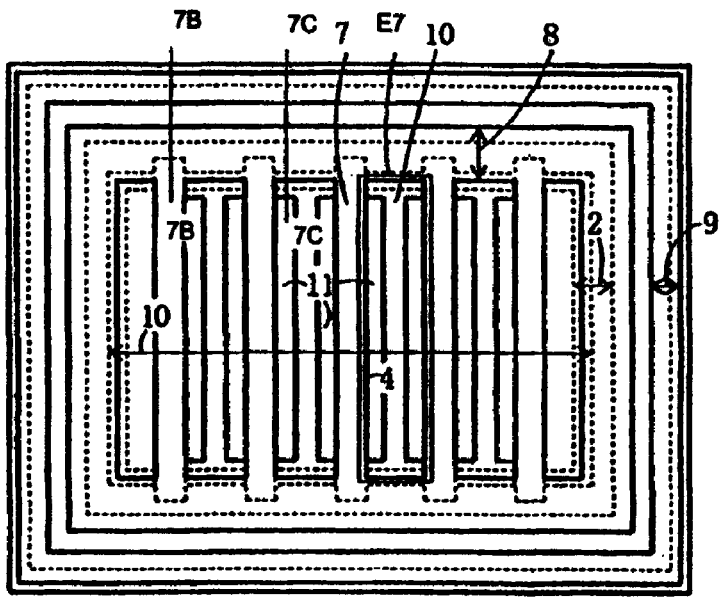
Figure 7B:
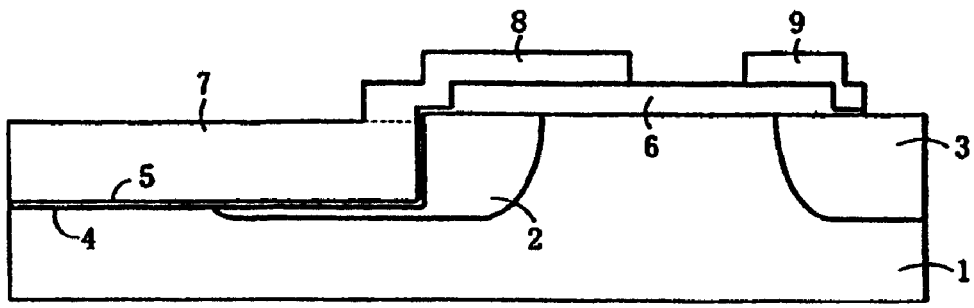
Figure 7C:
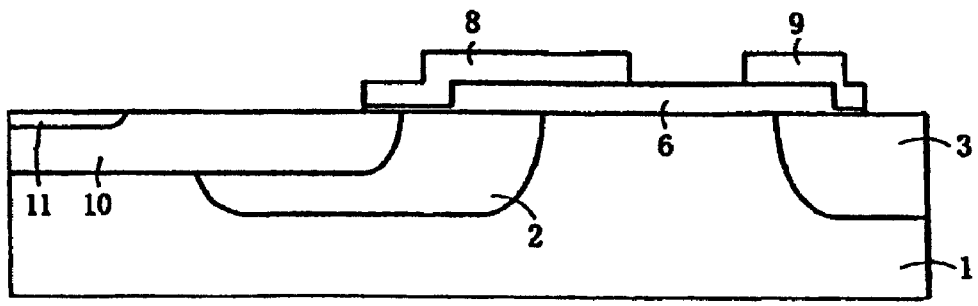
Figure 7D:
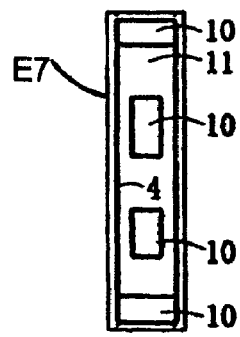

Subsequently, referring to FIGS. 7A-7C, n⁺ source regions 11 are formed adjacent to the trenches 4 (as surface layers) in the surface of the p-well region 10 using a patterned oxide film (not shown) as a mask. Although in FIGS. 7A-7C, the n⁺ source regions 11 are stripes, ladder-shaped n⁺ source regions 11 can be formed as shown in FIG. 7D, which is an enlarged view of section E7 of FIG. 7A.

Figure 8A:
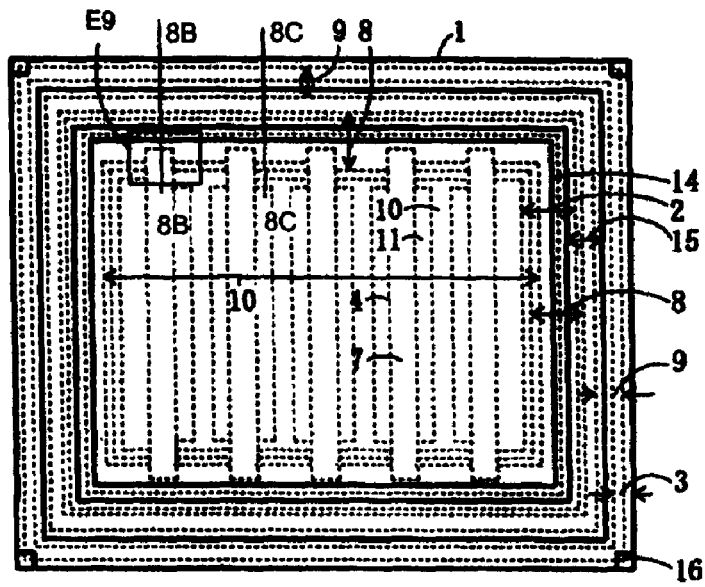
Figure 8B:
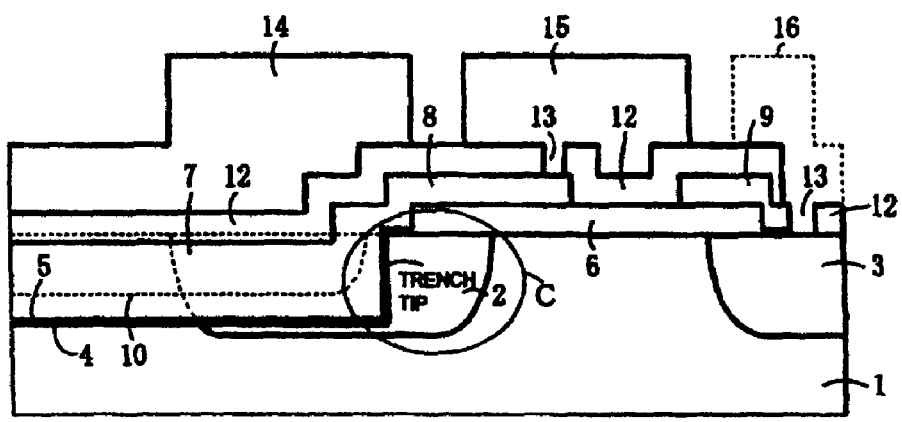
Figure 8C:
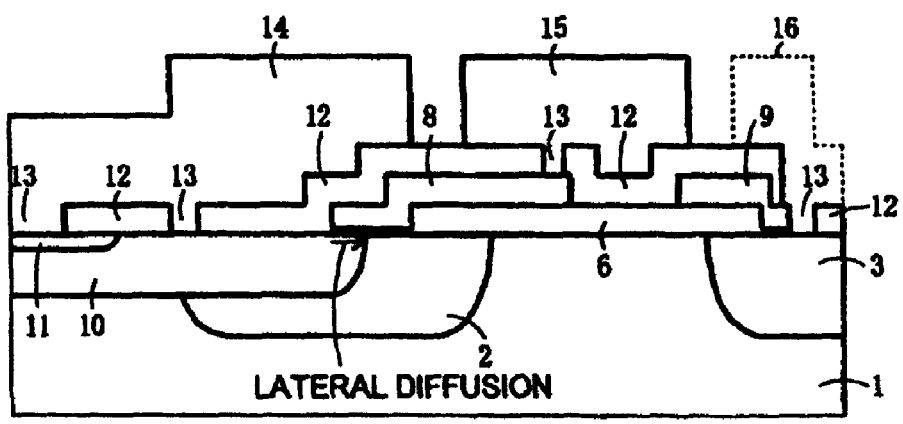

Finally, as shown in FIGS. 8A-8C, an interlayer insulating film 12 and contact holes 13 are formed. A source electrode 14 is formed to connect to the n⁺ source regions 11, a gate metal interconnection 15 is formed to connect to the gate polysilicon interconnection 8, and metal films 16 are formed connecting to the p-type end region 3 and the end polysilicon film 9. The metal films 16 are formed at the chip corners. The trench gate MOSFET having the p⁻ RESURF region is thus completed.

Figure 9:
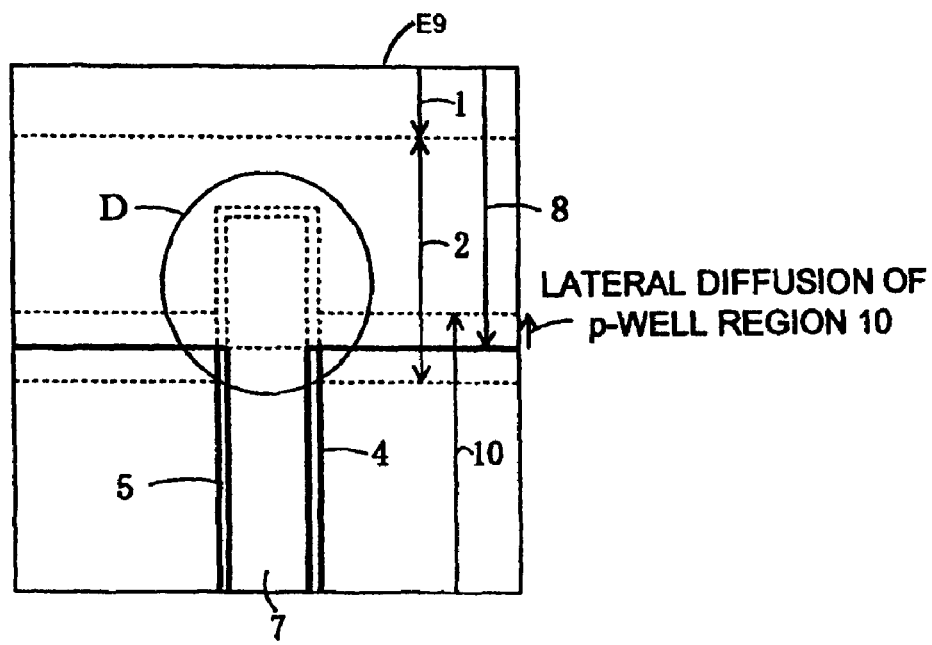
FIG. 9 is an enlarged view of section E9 of FIG. 8A.
Figure 10:
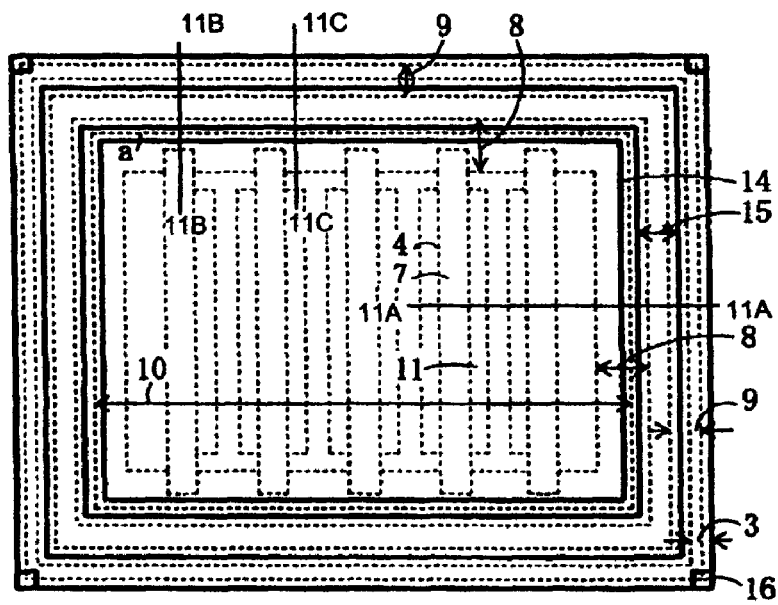
FIG. 10 schematically illustrates a plan view of a conventional MOSFET having trench gate electrodes.
Figure 11A:
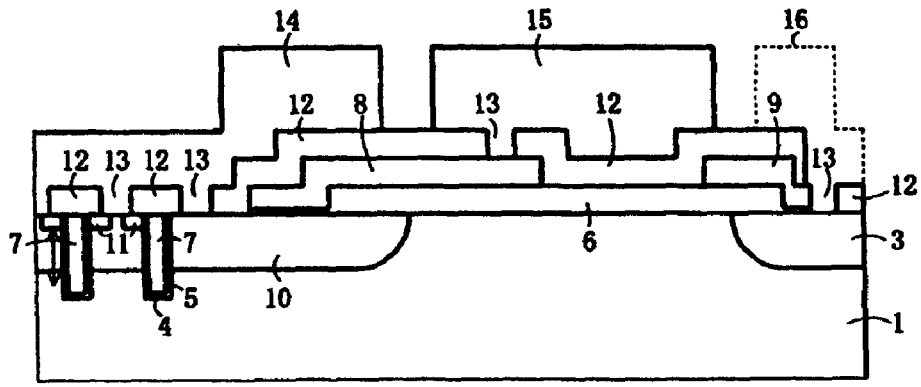
FIGS. 11A-11C schematically illustrate sectional views taken along lines 11A-11A, 11B-1B, and 11C-11C of FIG. 10.
Figure 11B:
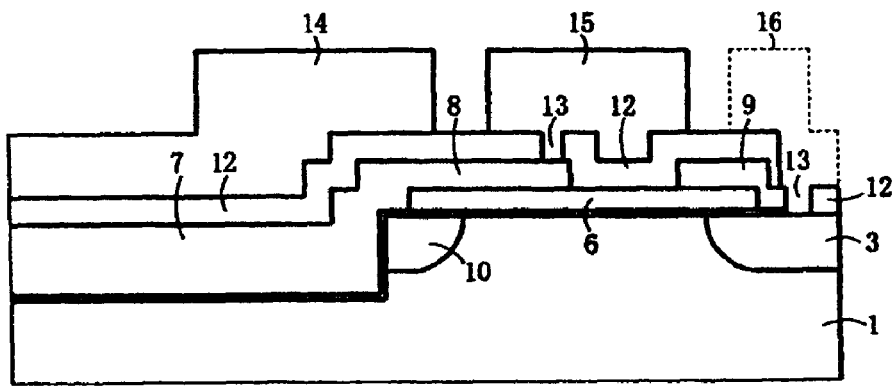
Figure 11C:
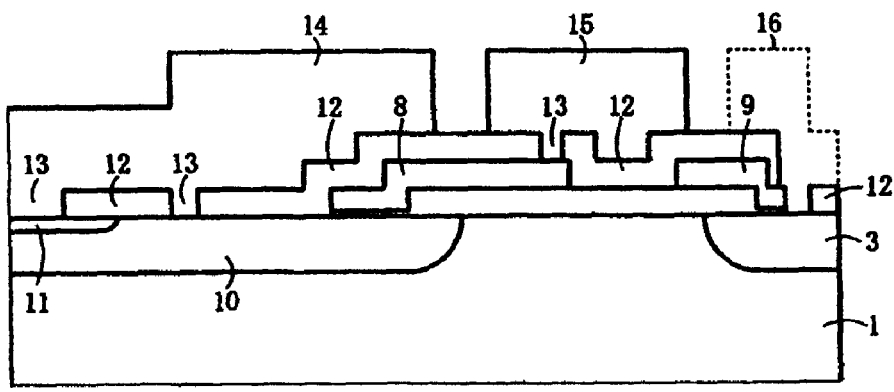
Figure 12A:
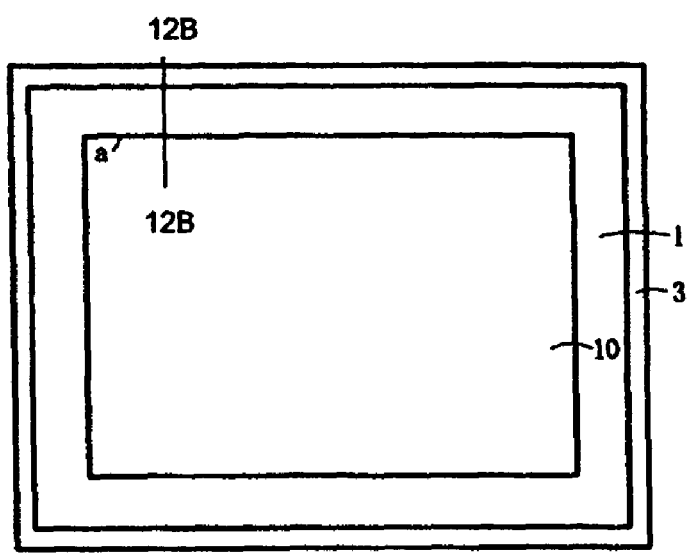
FIGS. 12A-12B to FIGS. 16A-16C schematically illustrate the manufacturing process of the conventional MOSFET having trench gate electrodes of FIGS. 10 and 11A-11C.
Figure 12B:
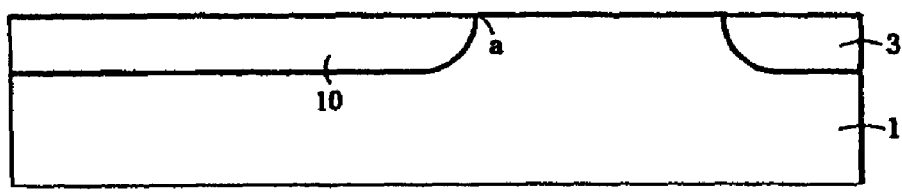
Figure 13A:
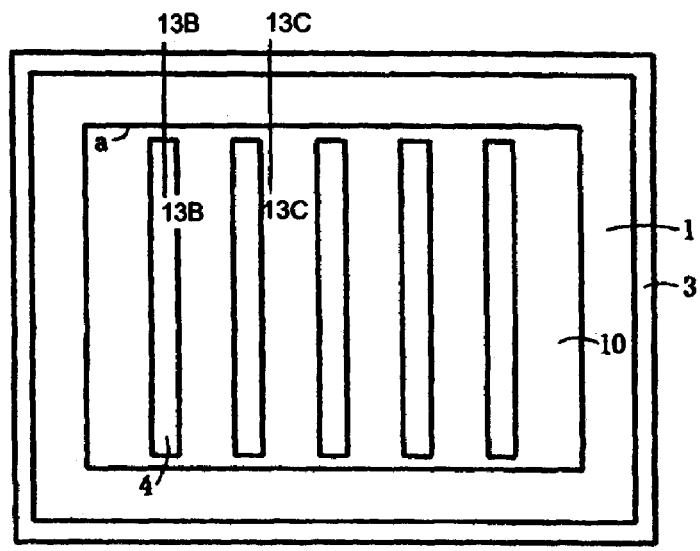
Figure 13B:
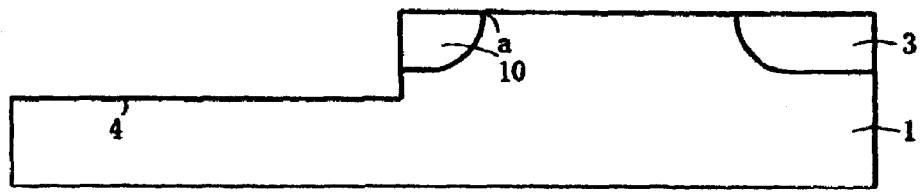
Figure 13C:
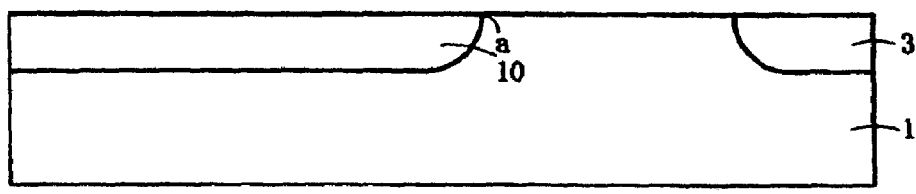
Figure 14A:
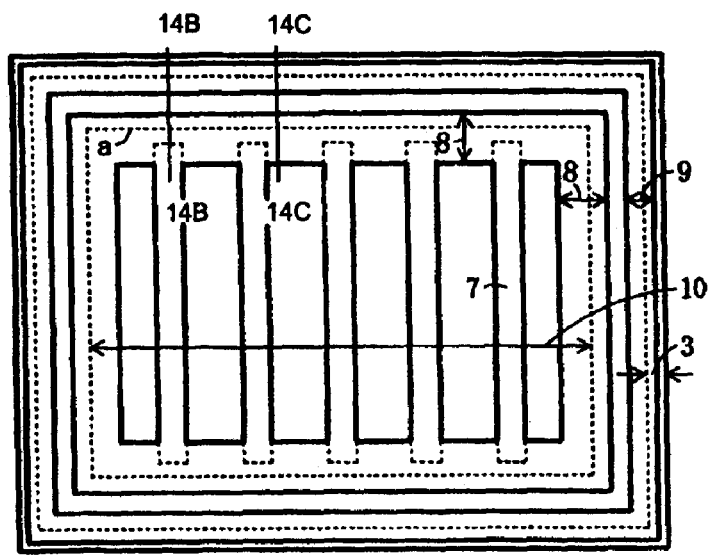
Figure 14B:
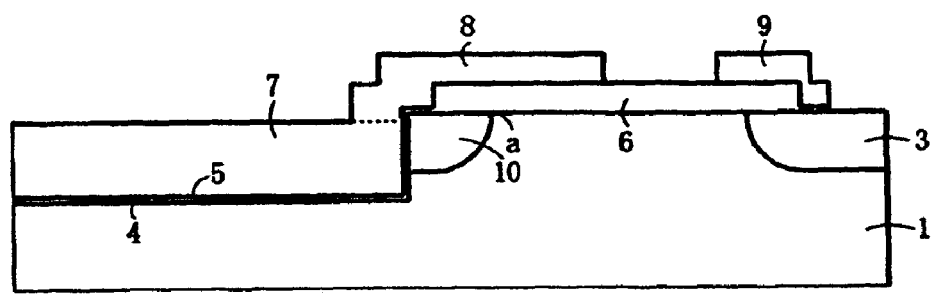
Figure 14C:
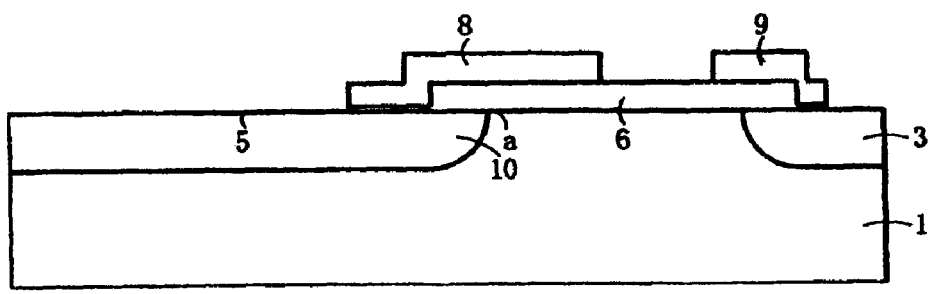
Figure 15A:
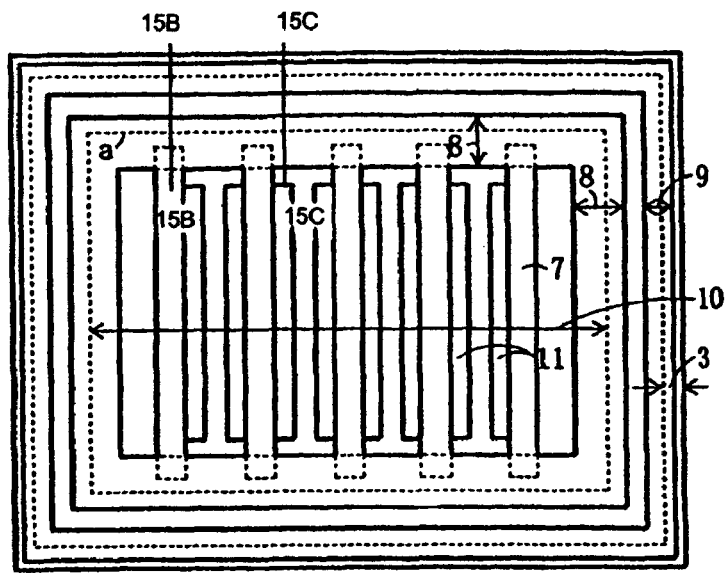
Figure 15B:
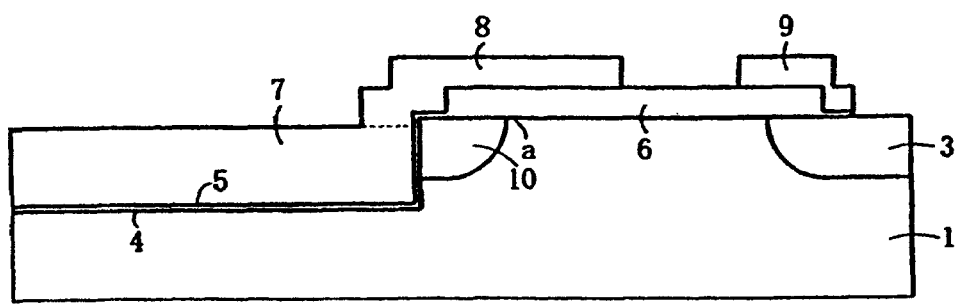
Figure 15C:
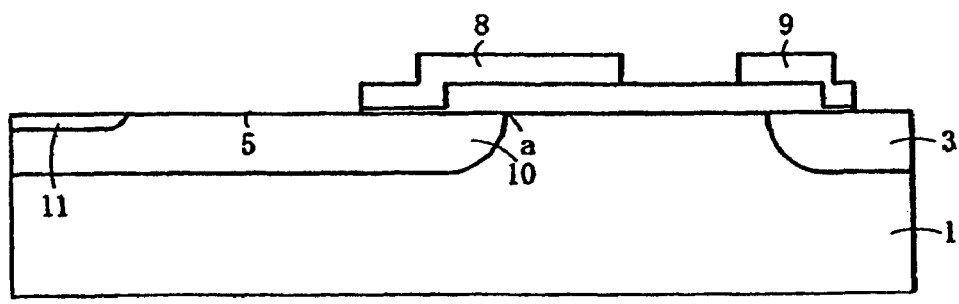
Figure 16A:
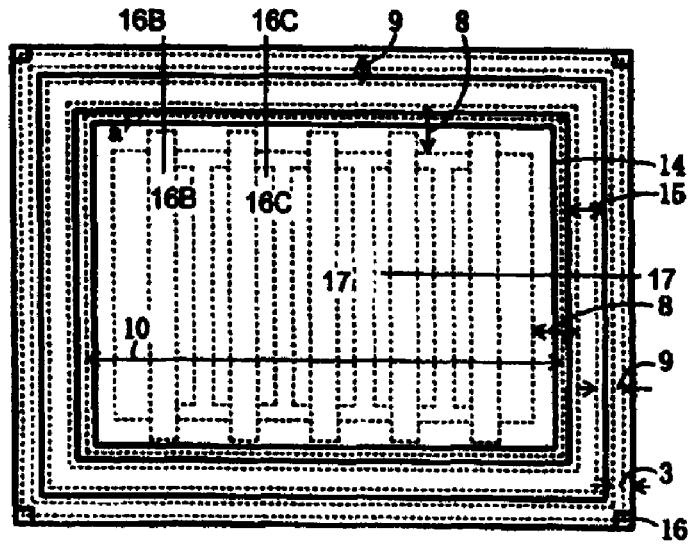
Figure 16B:
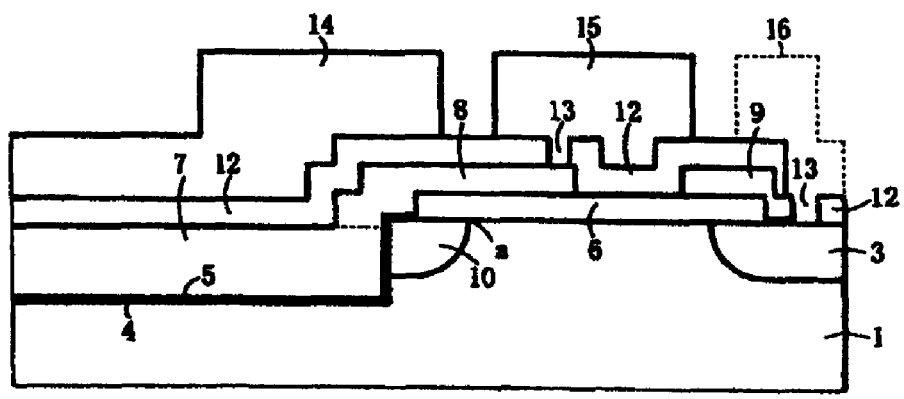
Figure 16C:
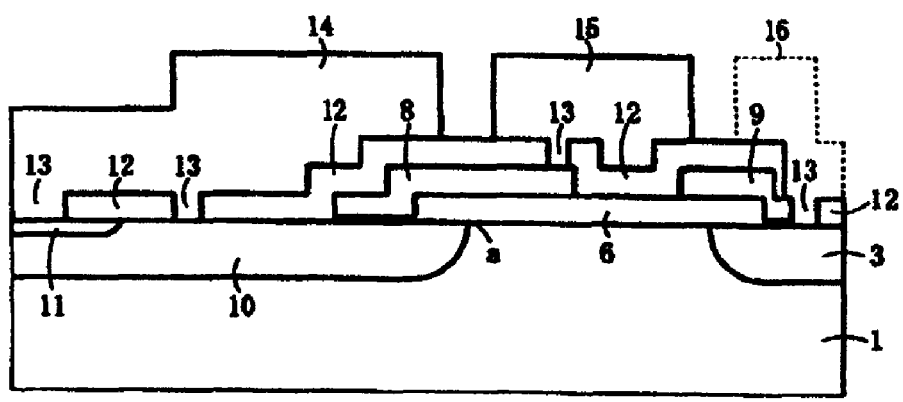
Figure 17:
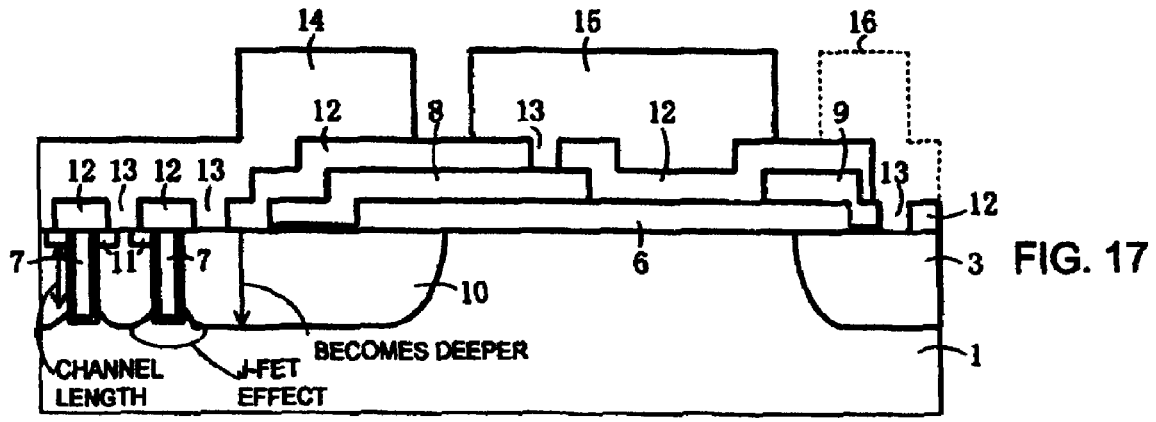
FIG. 17 schematically illustrates a phenomenon in which the diffusion length of a p-well region is increased by a heat history.
Figure 18:
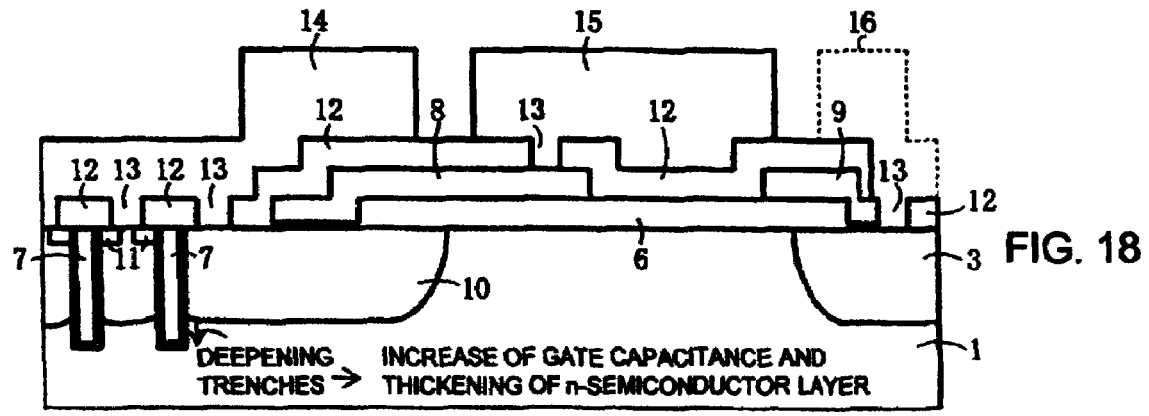
FIG. 18 schematically illustrates a MOSFET in which the trenches are made deeper.
Figure 19:
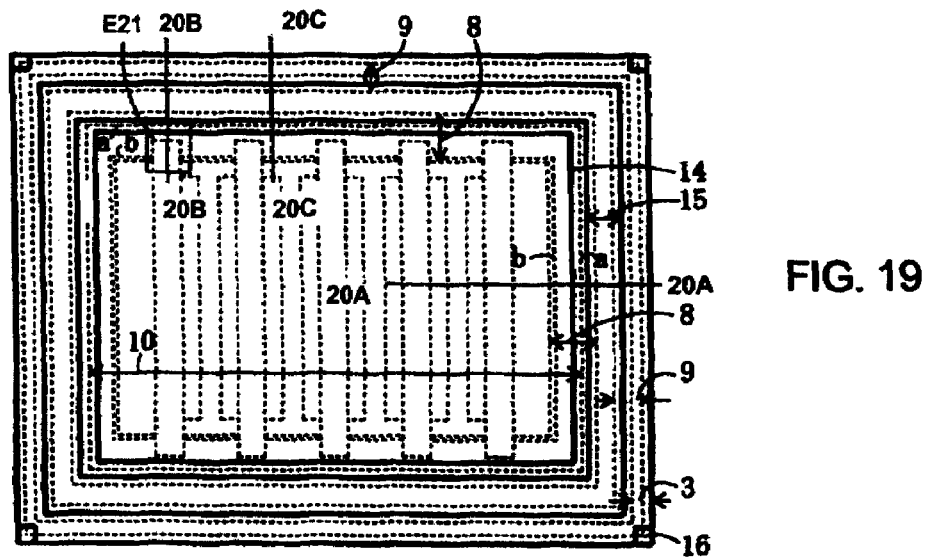
FIG. 19 schematically illustrates a plan view of a MOSFET manufactured by forming a p-well region after forming the trench gates.
Figure 20A:
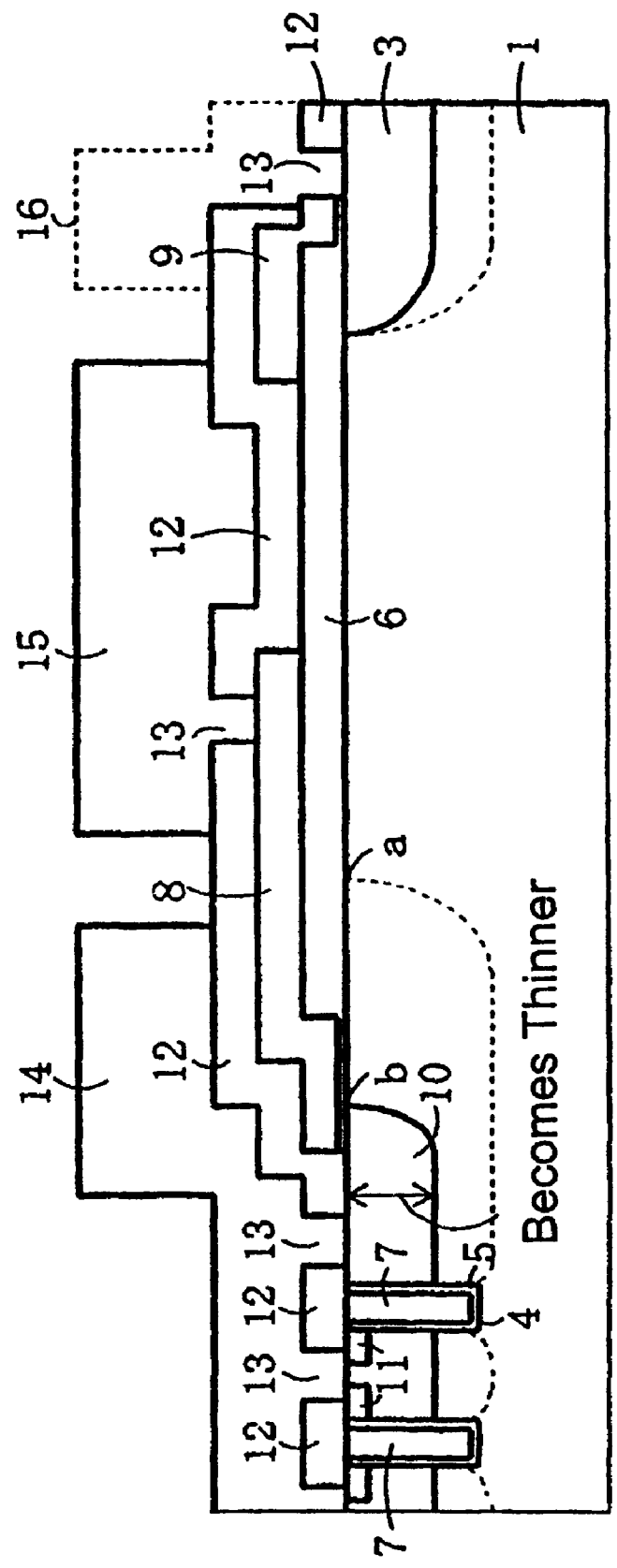
FIGS. 20A-20C schematically illustrate sectional views taken along lines 20A-20A, 20B-20B, and 20C-20C of FIG. 19.
Figure 20B:
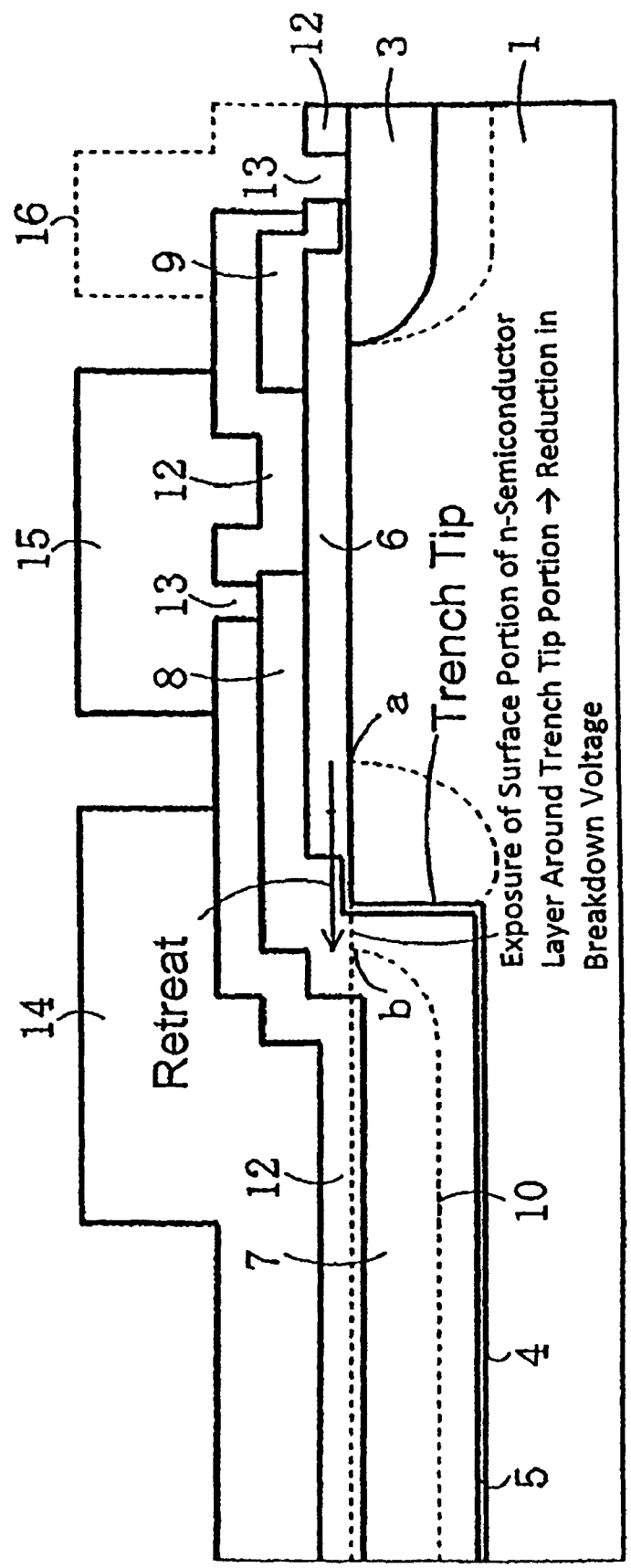
Figure 20C:
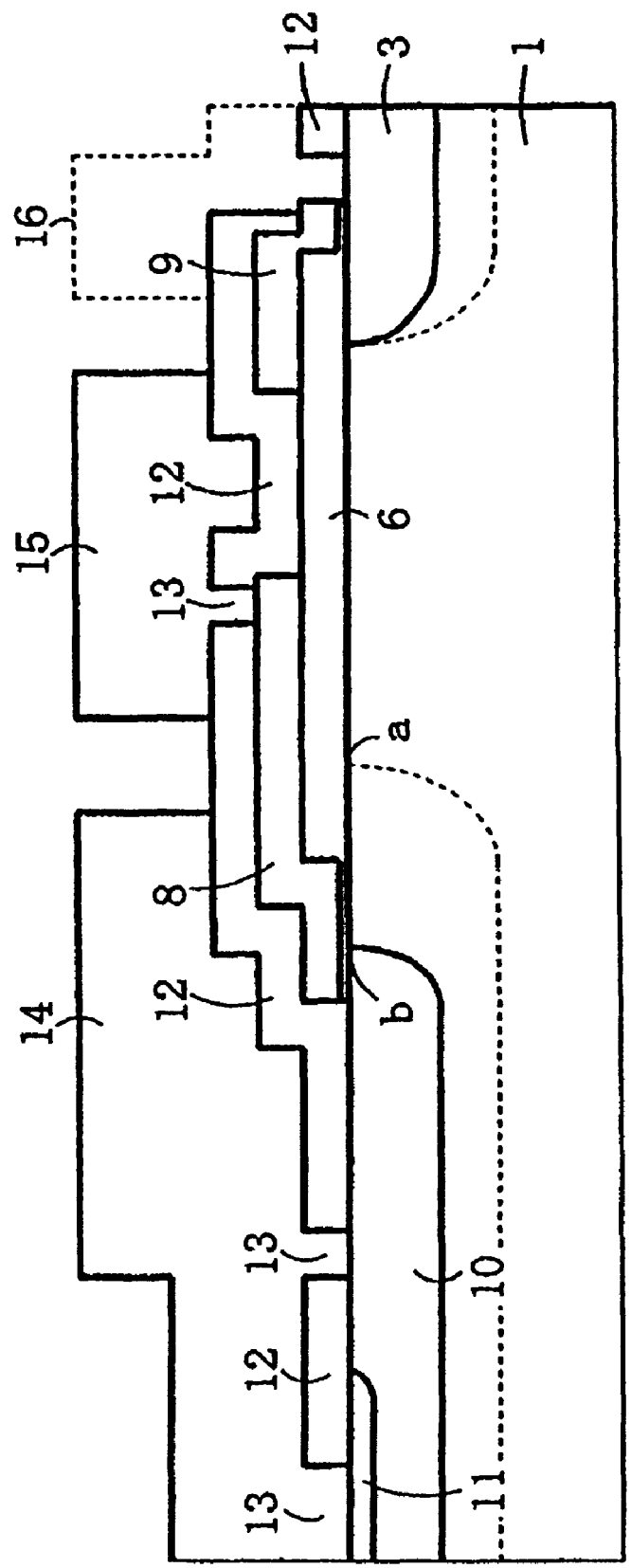
Figure 21:
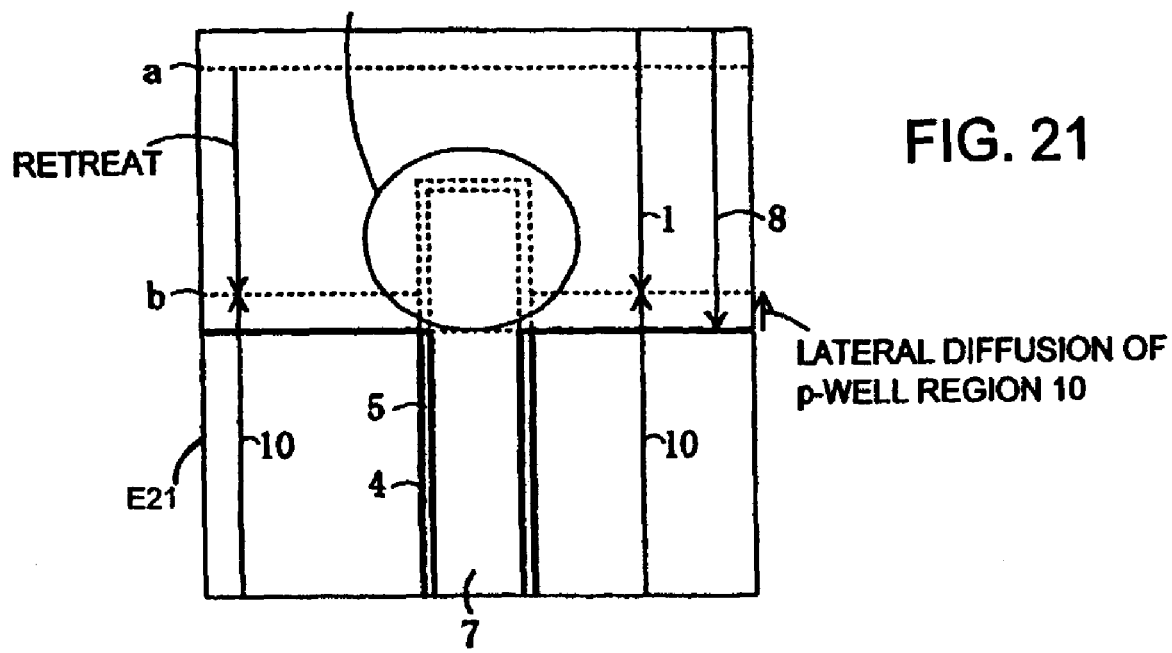
FIG. 21 is an enlarged view of section E21 of FIG. 19.

In this trench gate MOSFET, the p⁻ RESURF region 2 is formed connected to opposite end portions of the p-well region 10. As shown in section C of FIG. 8B and section D of FIG. 9, which is an enlarged view of section E9 of FIG. 8A, those portions of the n⁻ semiconductor layer 1 close to the tip portions of the trenches 4 are located in the p⁻ RESURF region 2.

The formation of the p⁻ RESURF region 2 makes it possible to form the p-well region 10 after forming the trenches 4, the gate insulating films 5, the thick insulating film 6, the gate electrodes 7, and the gate polysilicon interconnection 8 in this order. Moreover, since the p-well region 10 is formed at a later step, the high-temperature heat history to which the p-well region 10 is subjected to conventionally in the steps of forming the gate insulating films 5, the thick insulating film 6, etc., is eliminated or lowered. As a result, the final diffusion depth of the p-type well region 10 becomes smaller than in the conventional case. Hence, the trenches 4 can be made shallower than in the conventional case.

In the conventional process, in the case where the gate insulating films 5 are oxide films, the gate oxide films absorb the p-type impurity from the p-well region 10 in the heat-history-causing steps and the impurity concentration of the p-well region 10 is lowered in portions close to the side surfaces of the trenches 4, where a J-FET effect occurs in their vicinities. In contrast, the manufacturing method according to the invention lowers the severeness of the heat history, thereby decreasing the influence of the J-FET effect.

Moreover, since the diffusion depth of the p-well region 10 becomes smaller according to the present method, the channel resistance and the on-resistance are decreased. Furthermore, since the diffusion depth of the p-well region 10 becomes smaller, the gate capacitance can be reduced. Also, the $n^-$ semiconductor layer 1 ($n^-$ drift layer) can be made thinner. Moreover, since the influence of the J-FET effect is weakened, the channel resistance etc., are reduced, and the $n^-$ semiconductor layer 1 ($n^-$ drift layer) can be made thinner, the on-resistance of the MOSFET can be reduced. Furthermore, since the $p^-$ RESURF region 2 is formed outside the p-well region 10, the breakdown voltage can be increased.

The breakdown voltage thus can be increased because the RESURF region is formed. If the breakdown voltage is kept the same, the crystal resistance can be decreased by a corresponding amount, which makes it possible to lower the resistance of the drift layer ($n^-$ semiconductor layer 1) to thereby reduce the on-resistance. Since the well region (channel region) connected to the RESURF region is formed after forming the trench gates, the trenches can be made shallower and the severeness of a heat history can be lowered.

Since the severeness of the heat history is lowered, the p-well region (channel region) becomes shallower and the channel length is thereby shortened. As a result, the channel resistance and the influence of the J-FET effect can be reduced and the on-resistance can be decreased. Since the trenches are made shallower, the gate capacitance can be reduced, which makes it possible to improve the switching characteristic (i.e., lower the switching loss).

The above-mentioned references do not disclose using a combination of a $p^-$ RESURF region and the formation of a p-well region after gate oxide films and gate electrodes. Naturally, they do not disclose advantages of this combination.

While the present invention has been particularly shown and described with reference to exemplary embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Applications 2007-276456 filed on 24 Oct. 2007. The disclosure of the priority application in their entirety, including the drawings, claims, and the specification thereof, is incorporated herein by reference.

What is claimed is:

1. A method of forming a semiconductor of a MOSFET or IGBT, comprising the steps of:
    forming a RESURF region of a second-conductivity type in one surface of a semiconductor layer of a first-conductivity type, wherein the RESURF region has an annular configuration;
    forming a plurality of trenches from the one surface of the semiconductor layer after forming the RESURF region, wherein each of the trenches has a striped configuration and a depth smaller than a diffusion depth of the RESURF region, and wherein the RESURF region surrounds the trenches with opposite longitudinal ends of each of the trenches overlapping portions of the RESURF region;
    forming trench gate electrodes in the trenches with a first insulating film interposed between each of the trench gate electrodes and the trenches after forming the trenches;
    forming a well region of the second-conductivity type in the one surface of the semiconductor layer, wherein the well region intersects the RESURF region.

2. A method of manufacturing of a semiconductor device, comprising the steps of:
    providing a semiconductor layer of a first-conductivity type;
    forming a first semiconductor region of a second-conductivity type in one surface of the semiconductor layer, wherein the first semiconductor region has an annular configuration;
    forming a plurality of trenches from the one surface of the semiconductor layer, wherein each of the trenches having a striped configuration and a depth smaller than a diffusion depth of the first semiconductor region, and wherein the first semiconductor region surrounds the trenches with opposite longitudinal ends of each of the trenches overlapping portions of the first semiconductor region;
    covering the trenches and portions of the first semiconductor region adjacent to the opposite longitudinal ends of the trenches with a first insulating film;
    covering an outer portion of the first semiconductor region and a portion of the semiconductor layer surrounding the first semiconductor region with a second insulating film that is thicker than the first insulating film, wherein the second insulating film is connected to the first insulating film;
    filling each of the trenches with a conductive material, with the first insulating film interposed in between;
    covering part of the second insulating film with the conductive material;
    forming a second semiconductor region of the second-conductivity type in the one surface of the semiconductor layer using the conductive material as a mask, wherein an impurity concentration of the second semiconductor region is higher than that of the first semiconductor region, a diffusion depth of the second semiconductor region is smaller than the depth of the trenches, and an outer portion of the second semiconductor region coextends with an inner portion of the first semiconductor region; and
    forming third semiconductor regions of the first-conductivity type in the one surface of the semiconductor layer, wherein the third semiconductor regions are formed adjacent to side surfaces of the trenches and extend along a longitudinal direction of the trenches, and wherein an impurity concentration of the third semiconductor regions is higher than the impurity concentration of the second semiconductor region.

3. The method according to claim 2, wherein the first semiconductor region is a RESURF region, the second semiconductor region is a well region, the first insulating film includes gate insulating films, and the second insulating film is a thick insulating film.

4. The method according to claim 2, wherein the annular shape of the first semiconductor region is substantially rectangular, with rounded corners, and the longitudinal direction of the trenches is parallel to at least one straight portion of the annular first semiconductor region.

5. The method according to claim 4, wherein the conductive film and the annular first semiconductor region each has an opening, the opening in the conductor film is larger than and similar to the opening in the annular first semiconductor region.

6. The method according to claim 2, wherein the semiconductor is a MOSFET or IGBT.

* * * * *